United States Patent [19]

Harada

[11] Patent Number: 5,391,923
[45] Date of Patent: Feb. 21, 1995

[54] TAPE CARRIER INCLUDING LEADS ON BOTH SIDES AND RESIN-ENCAPSULATED SEMICONDUCTOR DEVICE INCORPORATING THE TAPE CARRIER

[75] Inventor: Kouzou Harada, Itami, Japan

[73] Assignee: Mitsubishi Denki Kabushiki Kaisha, Tokyo, Japan

[21] Appl. No.: 135,570

[22] Filed: Oct. 14, 1993

[30] Foreign Application Priority Data

Oct. 15, 1992 [JP] Japan ................... 4-277443

[51] Int. Cl.⁶ ............... H01L 23/28; H01L 23/48; H01L 29/46; H01L 29/62
[52] U.S. Cl. ...................... 257/787; 257/666; 257/668
[58] Field of Search ............ 257/666, 667, 668, 671, 257/787

[56] References Cited

U.S. PATENT DOCUMENTS

| | | | |
|---|---|---|---|
| 2,054,609 | 9/1936 | Barrett | 228/22 |
| 4,648,481 | 3/1987 | Lee | 182/28 |
| 5,064,706 | 11/1991 | Ueda et al. | 257/667 |
| 5,196,917 | 3/1993 | Ueda et al. | 257/666 |

FOREIGN PATENT DOCUMENTS

| | | |
|---|---|---|
| 3505907 | 2/1985 | Germany . |
| 3627303 | 12/1988 | Germany . |
| 8906444 | 5/1989 | Germany . |
| 63-204735 | 8/1988 | Japan . |
| 1216815 | 8/1989 | Japan . |
| 290632 | 3/1990 | Japan . |
| 338634 | 4/1991 | Japan . |
| 4042040 | 12/1978 | United Kingdom . |
| 2089873 | 12/1981 | United Kingdom . |

*Primary Examiner*—Edward Wojciechowicz
*Assistant Examiner*—S. V. Clark
*Attorney, Agent, or Firm*—Leydig, Voit & Mayer

[57] ABSTRACT

A tape carrier includes an electrically insulating carrier tape having a first tape surface to which a heat-dissipating metal cap is attached and a second tape surface opposite the first tape surface, a plurality of leads disposed on each of the tape surfaces and a surface area on the second tape surface free of leads for mounting a resin injection runner of a mold die directly on the tape. The present invention also includes a semiconductor device using the tape carrier and a method for manufacturing the semiconductor device.

6 Claims, 5 Drawing Sheets

TAPE CARRIER INCLUDING LEADS ON BOTH SIDES AND RESIN-ENCAPSULATED SEMICONDUCTOR DEVICE INCORPORATING THE TAPE CARRIER

BACKGROUND OF THE INVENTION

This invention relates to a tape carrier and, more particularly, to a tape carrier for use in a molded Tape Carrier Package (T.C.P.) structure. This invention also relates to a semiconductor device on the tape carrier and a method of making the same.

FIG. 5 is a sectional view illustrating a known tape carrier for use in a T.C.P. In FIG. 5, a tape carrier 5 comprises a carrier tape 1 made, for example, of polyimide, leads 2 disposed on the top surface of the carrier tape 1 and testing pads 3 disposed on the top surface of the carrier tape 1 and electrically connected to one end of each of the leads 2 for use in testing. A resist 4 is disposed on the carrier tape 1 as well as on the lead 2.

FIG. 6 is a top plan view of a known semiconductor device using the known tape carrier 5 illustrated in FIG. 5 but with the resin removed for clarity. As illustrated in FIG. 6, a plurality of the leads 2 are electrically connected at one end to the testing pads 3 and electrically connected at the other end to a semiconductor chip 6 and extend outwardly from each side of the semiconductor chip 6. Perforations 18 along both sides of the carrier tape 1 are at fixed intervals along straight lines. During manufacture and test, the carrier tape 1 is fed and held in place by a sproket wheel (not shown) engaging the perforations 18.

The testing pads 3 are disposed close to the perforations 18 so that the testing pads 3 can be touched easily with, for example, a testing pin (not shown) during testing. Since the testing pads 3 have a width such as 0.7 mm which is wide as compared with that of the leads 2 and the testing pads 3 are disposed at very minute intervals such as about a few hundred μm, it has been recently difficult to increase the number of the testing pads 3 with an increase in the number of the leads 2. Further, as seen from FIG. 6, a hole 8 is disposed in the carrier tape 1 through which molten resin flows on the top side of the carrier tape 1 from the underside thereof when the semiconductor chip 6 is being molded together with the tape carrier 5 in a metal die.

FIG. 7 is a sectional view taken along line 7—7 in FIG. 6 and illustrates one example of a known molding method. As seen from FIG. 7, the semiconductor chip 6 is mounted on a heat radiating metal cap 9. The semiconductor chip 6 is electrically connected to the leads 2 and the testing pads 3 through a bump 7 which is disposed on the semiconductor chip 6. The heat radiating metal cap 9 is a substantially dish-shaped member having a circumferential brim 9a at its edge which is attached to the bottom surface of the carrier tape 1 and an inside bottom to which the semiconductor chip 6 is attached. The tape carrier 5 and the semiconductor chip 6 as described above are clamped between mold dies for molding together with the heat radiating metal cap 9. The mold dies are composed of an upper die 10 and a lower die 11 which form a cavity 14 therebetween for accommodating the semiconductor chip 6, the tape carrier 5 and the heat radiating metal cap 9. Further, a first resin-supply runner 12 is provided in the lower die 11 to let the molten resin flow therethrough and a second resin-supply runner 13 is disposed in the upper die 10 which is connected to the first resin-supply runner 12 through the hole 8 in the carrier tape 1. The first runner 12 is placed at the position illustrated by a phantom line in FIG. 6. As illustrated in FIG. 7, disposed between the second runner 13 and the cavity 14 is a gate 15 through which the molten resin 16 flows into the cavity 14 from the second runner 13.

If the mold resin 16, which is attached to the testing pads 3 and the leads 2 which are disposed on the carrier tape 1 during molding, is cured and fixed on the testing pads 3 and the leads 2, the testing pads 3 and the leads 2 may be peeled off from the carrier tape 1 together with the resin 16 during the gate-breaking process for removing the runners 12 and 13. Accordingly, in order to prevent the molten resin 16 from attaching to the testing pads 3 and the leads 2, the molten resin 16 may be caused to flow under the carrier tape 1 through the first runner 12 disposed in the lower die 11 and is injected into the cavity 14 in a manner known as the low pressure transfer molding method. However, as the molten resin 16 cannot be directly injected into the cavity 14 from the first runner 12 disposed under the carrier tape 1 because of the heat radiating metal cap 9, the hole 8 must be disposed in the carrier tape 1 upstream of the cavity 14 so that the molten resin 16 flows from the underside of the carrier tape 1 to the top side thereof through the hole 8 and injected into the cavity 14 through the gate 15.

If there is a portion 14a defined outside of the heat radiating metal cap 9 within the cavity 14 and in which the mold resin 16 cannot be easily injected, a communication hole 9b may be disposed in the heat radiating metal cap 9. In the gate-breaking process for removing the resin 16 within the runners 12 and 13, firstly, the resin 16 within the gate 15 is snapped off by bending the carrier tape 1. Since the resin 16 within the first runner 12 is connected to the resin within the second runner 13 through the hole 8, the resin 16 within the second runner 13 is taken out from there through the hole 8 as the carrier tape 1 is being flexed. FIG. 8 illustrates a conventional semiconductor device of the T.C.P. structure manufactured by the above-described method.

In the known molding process as described above, the carrier tape 1 is clamped between the upper die 10 and the lower die 11. However, the carrier tape 1 cannot be clamped around the hole 8 as illustrated in FIG. 9 since the second runner 12 is formed within the lower die 11. Therefore, these unclamped portions of the carrier tape 1 expand and sag loosely due to heat of the mold dies 10 and 11 and an undesirable gap 17 arises between the carrier tape 1 and the upper die 10 as well between the carrier tape 1 and the lower die 11. When the molten resin 16 is led from the first runner 12 to the second runner 13 through the communication hole 8, the molten resin 16 undesirably enters into the gap 17. After molding, the cured mold resin 16 within the gap 17 remains attached to the leads 2 and the testing pads 3 as undesirable burrs 19 illustrated in FIG. 8.

Further, in the known semiconductor device, since the first and second runners 12 and 13, which are respectively disposed on the upper side and the underside of the carrier tape 1 and connected to each other through the communication hole 8 disposed in the carrier tape 1, must be provided in the metal dies 10 and 11, the structures of the metal dies 10 and 11 are not simple and the gate-breaking process is not easy and not efficient.

Still further, the undesirable burrs 19 hinder the removal of the unnecessary mold resin 16 within the runners 12 and 13 during the gate-breaking process and the unnecessary resin 16 as well as the burrs 19 cannot be easily removed, resulting in a poor appearance and a poor formability.

SUMMARY OF THE INVENTION

Accordingly, one object of the present invention is to provide a tape carrier or a semiconductor device free from the above-discussed problems of the known tape carrier and the known semiconductor device.

Another object of the present invention is to provide a tape carrier or a semiconductor device having an improved assembling operations, in particular, gate-breaking operation efficiency.

Another object of the present invention is to provide a tape carrier or a semiconductor device which can be easily molded in metal dies which have simple structures.

A further object of the present invention is to provide a tape carrier or a semiconductor device which prevent an undesirable burr from being generated.

A still further object of the present invention is to provide a tape carrier or a semiconductor device having good lead formability.

Another object of the present invention is to provide a tape carrier or a semiconductor device in which leads can be disposed on both surfaces of the carrier tape and which can accommodate a comparatively large number of leads and testing pads.

With the above objects in view, a tape carrier according to the present invention comprises an electrically insulating carrier tape having two surfaces, a plurality of leads disposed on both of the surfaces of the carrier tape and a surface area defined on one of the tape surfaces. The surface area has no lead thereon and allows the resin injection runner of the mold die to be directly mounted thereon.

A semiconductor device according to the present invention comprises an electrically insulating carrier tape having two surfaces, a plurality of leads disposed on both of the tape surfaces, a semiconductor chip electrically connected to the leads and disposed on heat-dissipating means for radiating heat from the semiconductor chip, a surface area defined on one of the tape surfaces and a resin hermetically sealing therein the semiconductor chip, the heat-dissipating means, the carrier tape and the leads. The surface area has no lead thereon and allows the resin injection runner of the mold die to be directly mounted thereon.

The present invention also resides in a method for manufacturing a semiconductor device comprising the steps of preparing the tape carrier of the present invention as described above, electrically connecting the leads to a semiconductor chip disposed on heat-dissipating means, directly mounting a resin injection runner of a mold die on the surface of the tape carrier and mounting the semiconductor chip, the heat-dissipating means, the tape carrier and the leads in a molding die, filling the molding die with the molten resin through the resin injection runner of the mold die, curing the mold resin within the mold die to hermetically mold the semiconductor chip, the heat-dissipating means, the tape carrier and the leads, taking the semiconductor chip molded by the mold resin out of the die and cutting the semiconductor chip molded by the mold resin from the tape carriers.

BRIEF DESCRIPTION OF THE DRAWING

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
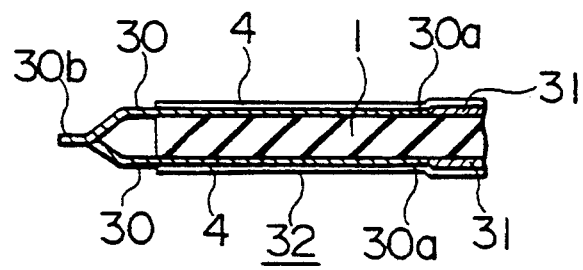
FIG. 1 is a sectional view of an embodiment of a tape carrier according to the present invention.

FIG. 1 is a sectional view illustrating an embodiment of a tape carrier 32 of the present invention for use in a Tape Carrier Package (T.C.P.). As illustrated in FIG. 1, the tape carrier 32 of the present invention comprises an electrically insulating carrier tape 1 having two major surfaces and made, for example, of polyimide and a plurality of leads 30 disposed on both of the major surfaces of the carrier tape 1. A plurality of testing pads 31 are also disposed on both of the major surfaces of the carrier tape 1 and each electrically connected to one end 30a of a corresponding lead 30. The other ends 30b of the leads 30 disposed on the top surface of the carrier tape 1 are curved gently and downwardly and the other ends 30b of the leads 30 disposed on the bottom surface of the carrier tape 1 are curved gently and upwardly so that the ends 30b of the leads on the top surface and on the bottom surface are in the same plane to be easily connected to a semiconductor chip 6. A resist 4 covers and is attached to all of both surfaces of the carrier tape 1 including on the leads 30.

Figure 2:
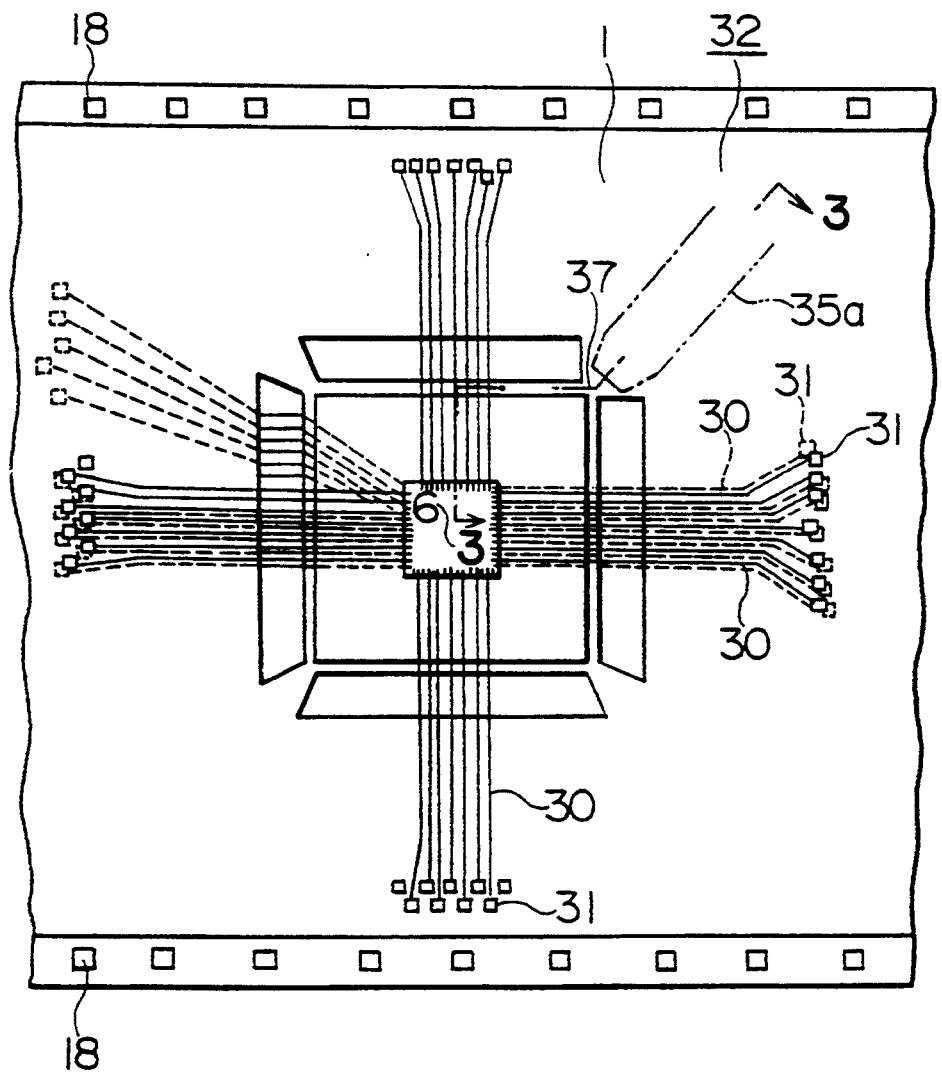
FIG. 2 is a top plan view of an embodiment of a semiconductor device including the tape carrier illustrated in FIG. 1 but with the resin removed for clarity.

In FIG. 2, the carrier tape 1 is an elongated rectangular member and a plurality of the semiconductor chips 6 are disposed on the middle portion of the carrier tape 1 parallel to the side of the elongated carrier tape 1 at regular intervals. A plurality of the leads 30, which are disposed on both surfaces of the carrier tape 1, are electrically connected to each side of the semiconductor chip 6. Therefore, the testing pads 31 and the semiconductor chip 6 are electrically connected to each other through the leads 30. Also, a plurality of perforations 18 are present along both sides of the carrier tape 1 at the fixed intervals along two straight lines. During manufacture, the carrier tape 1 is automatically fed and held in place by feeding means such as a sproket wheel (not shown) engaging the perforations 18. The testing pads 31 are disposed close to the perforations 18 so that the testing pads can be touched easily with a testing pin (not shown) during testing.

In the semiconductor device of the present invention, as illustrated in FIG. 2, since the leads 30 and the testing pads 31 are disposed on both of the top and bottom surfaces of the carrier tape 1, therefore, less than half of the leads 30 and the testing pads 31 may disposed on the top surface and so there is room on the top surface as compared with the known semiconductor device in which all the leads 30 and the testing pads 31 are disposed only on the top surface as described above. A surface area 35a is established on the top surface of the carrier tape 1 for directly positioning thereon a resin injection runner 35 (See FIG. 3) of a metal die during molding as illustrated by the phantom line in FIG. 2. As the leads 30 and the testing pads 31 can be disposed on all of both surfaces of the carrier tape 1 except for the surface area 35a, the semiconductor device of the present invention can accommodate almost twice as many of the leads 30 and the testing pads 31 as that of the known semiconductor device.

Figure 3:
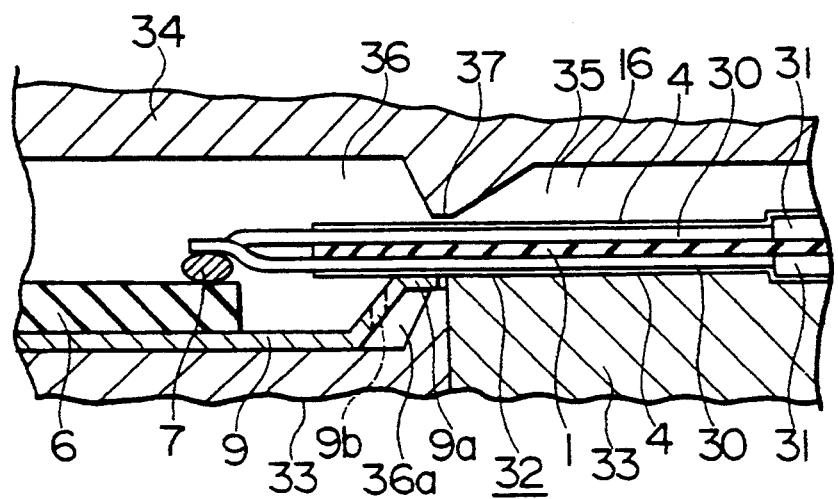
FIG. 3 is a sectional view taken along line 3—3 in FIG. 2 and illustrating the method of molding of the semiconductor device of the present invention.

FIG. 3 is a sectional view taken along line 3—3 in FIG. 2 and illustrates a method of manufacturing the semiconductor device of the present invention. In FIG. 3, the tape carrier 32 illustrated in FIG. 1 is disposed on a lower die 33 of a metal dies for molding and clamped by the lower die 33 and an upper die 34 of the mold dies. Also, a heat-radiating metal cap 9 is disposed on the lower die 33. The radiating metal cap 9 is a substantially dish-shaped member having a circumferential brim 9a at its edge. The semiconductor chip 6 is disposed within the radiating metal cap 9 and electrically connected to the leads 30 through a bump 7 which is disposed on the semiconductor chip 6. The circumferential brim 9a is attached to the bottom surface of the carrier tape 1 while the resist 4 prevents electrical short-circuiting therebetween. The resin injection runner 35 is disposed in the upper die 34 for introducing a molten resin 16 therethrough. The upper die 34 and the lower die 33 together form a mold cavity 36 therein accommodates the semiconductor chip 6 and the heat radiating metal cap 9. The runner 35 and the cavity 36 are connected to each other through a gate 37.

During molding, the molten resin 16 is introduced through the runner 35 on the top surface of the carrier tape 1. Since there are no leads 30 and no testing pads 31 in the runner 35, the molten resin 16 does not attach to the leads 30 and the testing pads 31. The molten resin 16 is led only on the top surface of the carrier tape 1 and injected into the cavity 36 from the runner 35 through the gate 37. In the semiconductor device of the present invention, as the carrier tape 1 can be clamped tightly by the upper and lower dies 34, 33 and there is no slack of the carrier tape 1 caused by thermal expansion of the carrier tape 1, an undesirable burr is prevented from being generated.

If there is a portion 36a disposed outside of the radiating metal cap 9 in the cavity 36 and the molten resin 16 cannot easily flow into the portion 36a, the through hole 9a may be disposed, if necessary, in the radiating metal cap 9.

Figure 4:
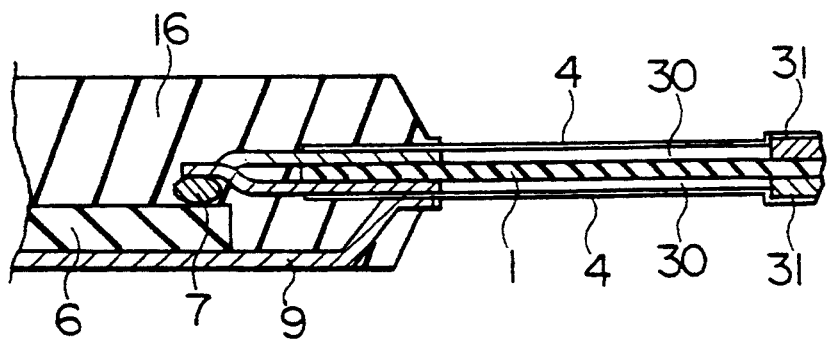
FIG. 4 is a sectional view of the semiconductor device illustrated in FIG. 2 after molding.
Figure 5:
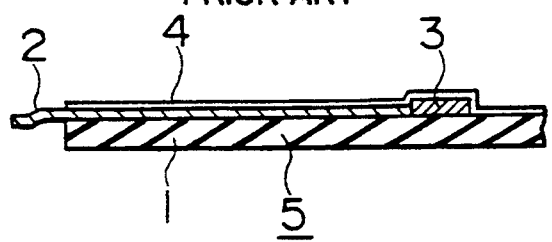
FIG. 5 is a sectional view of a known tape carrier.
Figure 6:
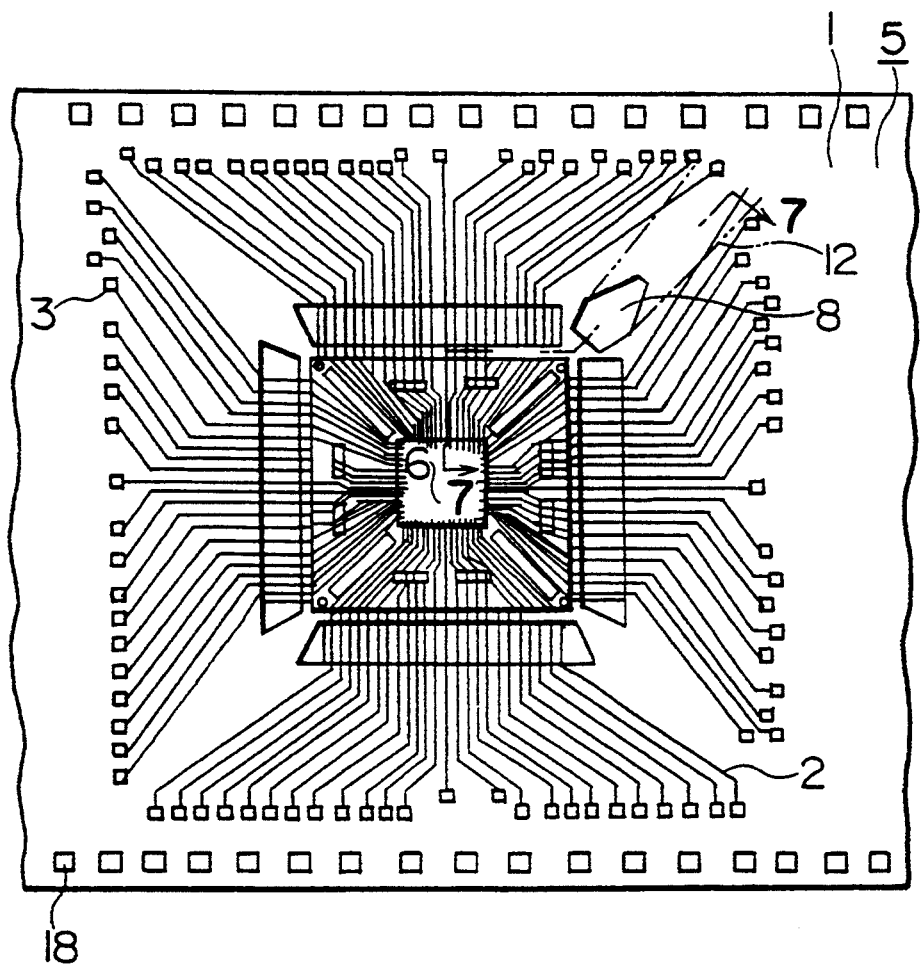
FIG. 6 is a top plan view of the known semiconductor device including the known tape carrier illustrated in FIG. 5 but with the resin removed for clarity.
Figure 7:
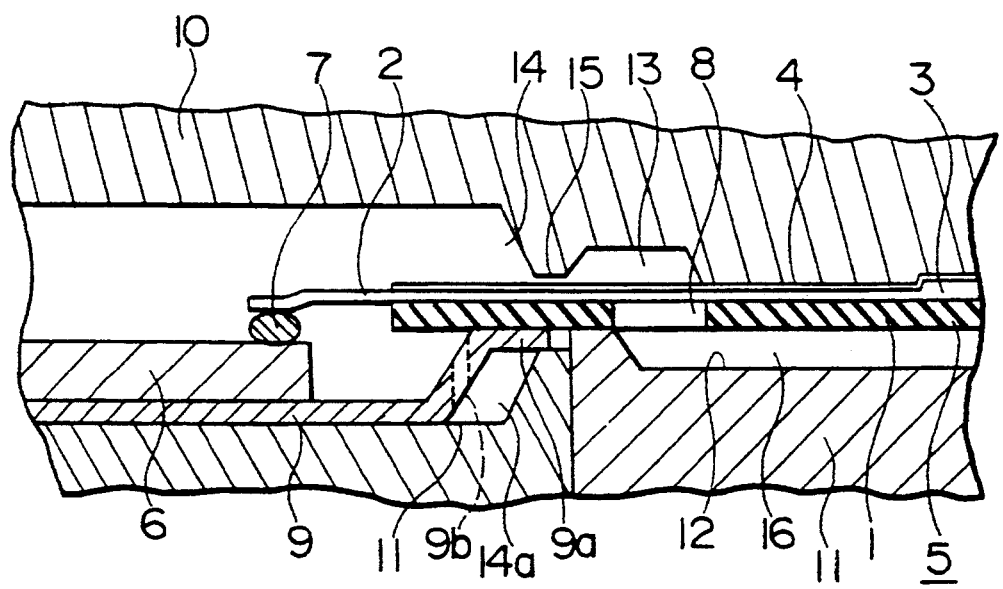
FIG. 7 is a sectional view taken along line 7—7 in FIG. 6 and illustrating the known method of molding of the known semiconductor device.
Figure 8:
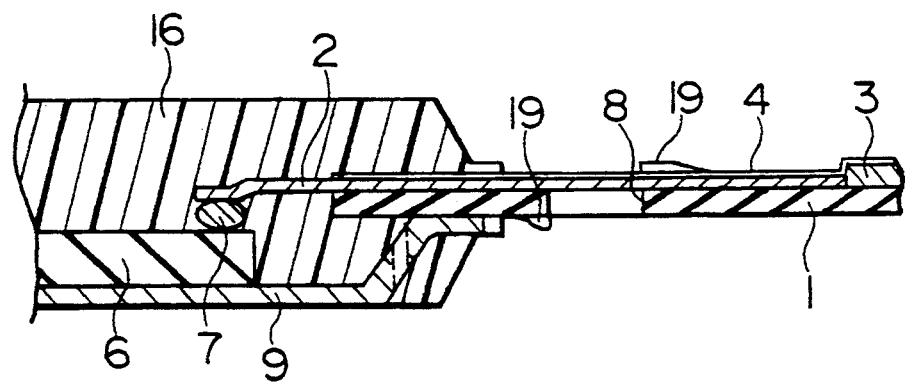
FIG. 8 is a sectional view of the known semiconductor device illustrated in FIG. 6 after molding.
Figure 9:
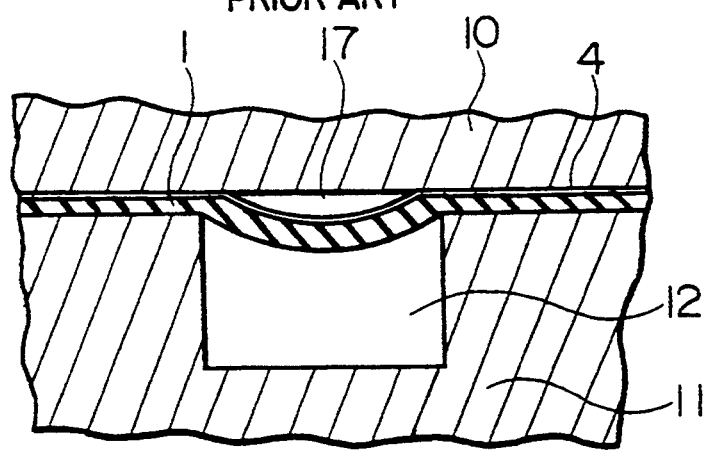
FIG. 9 is a sectional view illustrating a gap between the carrier tape and the metal die.

In the semiconductor device of the present invention, all that is required in the gate-breaking process is that the resin 16 within the gate 37 be snapped off by bending the carrier tape 1 so that the unnecessary mold resin 16 within the runner 35 is taken off the carrier tape 1. Hence ends of the leads 30 and the testing pads 31 are exposed outside as illustrated in FIG. 4.

As has been described, a tape carrier and a semiconductor device according to the present invention the leads 30 and the testing pads 31 are disposed on both surfaces of the carrier tape 1 so there is room on the top surface of the carrier tape 1 to dispose the surface area 35a for directly mounting the resin injection runner 35 of the metal die thereon. Further, during molding, the carrier tape 1 can be clamped tightly without slack in metal dies which have simple structures. The molten resin 16 can flow only on the top surface of the carrier tape 1 and no undesirable burr is generated resulting in an excellent appearance and good lead formability.

Also, in the gate-breaking process, the unnecessary resin 16 within the runner 35 can be removed easily and with a good appearance only by snapping off the mold resin 16 within the gate 37.

Still further, in the tape carrier and the semiconductor device of the present invention, as the leads 30 and the testing pads 31 can be disposed on the both surfaces of the carrier tape 1, a large number of the leads 30 and the testing pads 31, almost twice as many as those of the known tape carrier and the known semiconductor device as described above, can be accommodated.

What is claimed is:

1. A tape carrier for resin-molding a semiconductor chip comprising:
   an electrically insulating carrier tape having first and second opposed surfaces;
   a plurality of leads disposed on each of said first and second surfaces of said carrier tape; and
   a surface area on one of said first and second tape surfaces free of leads for mounting a resin injection runner of a mold die directly on said carrier tape.

2. A tape carrier for resin-molding a semiconductor chip attached to a heat-dissipating metal cap comprising:
   a heat dissipating metal cap;
   an electrically insulating carrier tape having a first tape surface attached to said heat-dissipating metal cap and a second tape surface opposite to said first tape surface;
   a plurality of leads disposed on each of said first and second tape surfaces; and
   a surface area on said second tape surface free of leads for mounting a resin injection runner of a mold die directly on said second tape surface.

3. The tape carrier as claimed in claim 1 wherein each of said leads comprises a testing pad provided at one end of the lead.

4. A semiconductor device comprising:
   heat-dissipating means for radiating heat;
   an electrically insulating carrier tape having opposed first and second surfaces;
   a plurality of leads disposed on each of said first and second surfaces of said carrier tape;
   a semiconductor chip electrically connected to said leads and disposed on said heat-dissipating means for radiating heat generated by said semiconductor chip, a surface area on said second surface free of leads for mounting a resin injection runner of a mold die directly on said second surface; and
   a resin hermetically encapsulating said semiconductor chip, said heat-dissipating means, said carrier tape, and said leads.

5. The semiconductor device as claimed in claim 4 wherein said heat-dissipating means is attached to said first surface of said carrier tape.

6. The semiconductor device as claimed in claim 4 wherein said heat-dissipating means comprises a heat radiating metal cap having an edge and a circumferential brim at the edge, said brim being attached to said first surface of said carrier tape.

* * * * *